United States Patent [19]

Mazgy et al.

[11] 3,882,328

[45] May 6, 1975

[54] CROSS OVER DETECTOR AND RECTIFIER

[75] Inventors: James Dimitri Mazgy, Parsippany, N.J.; Henry Martin Kleinman, Boca Raton, Fla.

[73] Assignee: RCA Corporation, New York, N.Y.

[22] Filed: Aug. 6, 1973

[21] Appl. No.: 385,655

[52] U.S. Cl........... 307/237; 307/252 UA; 307/254; 307/255; 307/264; 328/171

[51] Int. Cl... H03k 5/08; H03k 5/153; H03k 17/30

[58] Field of Search..... 307/237, 246, 252 UA, 255, 307/288, 313, 254, 264; 328/169, 171

[56] References Cited

UNITED STATES PATENTS

| | | | |
|---|---|---|---|
| 3,486,042 | 12/1969 | Watrous | 307/252 UA |
| 3,551,699 | 12/1970 | Karwacki | 307/246 |
| 3,619,656 | 11/1971 | Domke | 307/255 |

OTHER PUBLICATIONS

Austin, "Zero Voltage Cross-over Gating Sampler," RCA Technical Notes, TN No. 862, 4/15/1970, 1 sheet.

*Primary Examiner*—Michael J. Lynch
*Assistant Examiner*—L. N. Anagnos
*Attorney, Agent, or Firm*—H. Christofferson; S. Cohen

[57] ABSTRACT

In response to a voltage of greater than a given amplitude of one polarity, a switch is closed and current is caused to flow through that switch and a load. In addition, a charge storage means across the circuit of the switch and load is charged. In response to a voltage of greater than a given amplitude of opposite polarity, the switch again is closed and the charge storage means discharges through the switch and load. The switch preferably is one having current limiting properties, such as a transistor operated at saturation, so that the voltage developed across the load is of relatively constant amplitude when the switch conducts.

18 Claims, 6 Drawing Figures

CROSS OVER DETECTOR AND RECTIFIER

One of the goals in the design of integrated circuits is to minimize the surface area required to provide one or more circuit functions. The present application deals with a cross over detector circuit which requires fewer circuit elements than a previous circuit and which, when integrated, meets the goal above, that is, it requires significantly less area than the circuit it replaces.

The invention is illustrated in the drawing of which:

Figure 1:
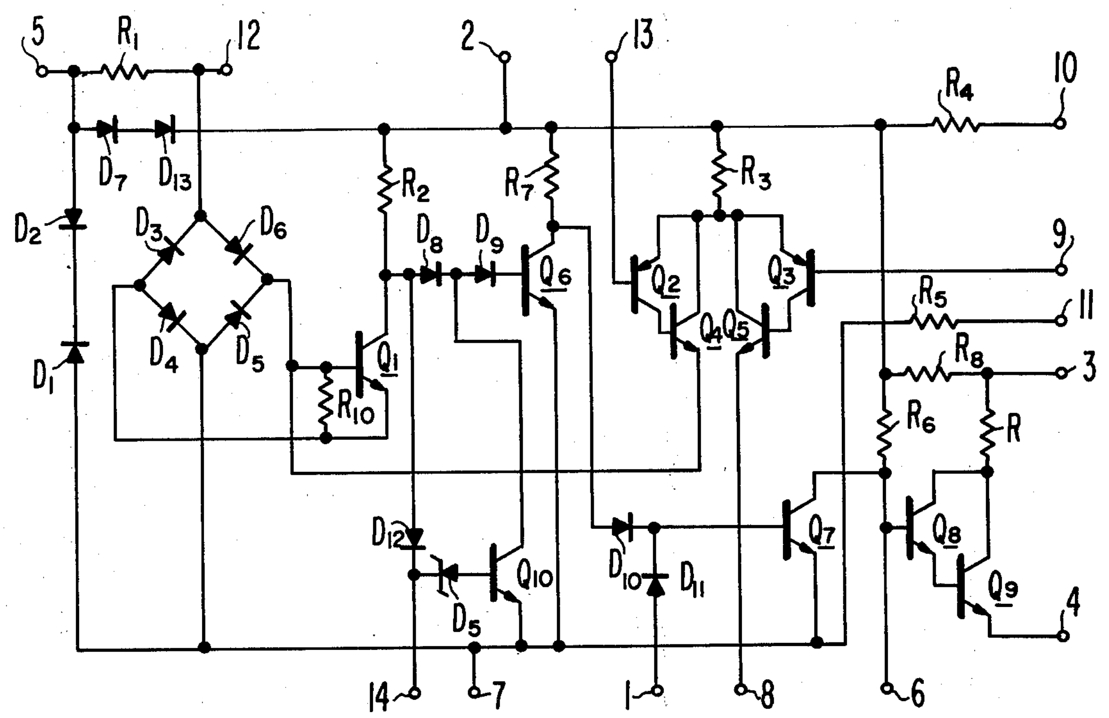
FIG. 1 PRIOR ART
FIG. 1 is a schematic diagram of a prior art, commercially available integrated circuit incorporating a clipping circuit and a zero-voltage crossover detection circuit.

FIG. 1 is a circuit diagram of the RCA-CA3059, which is a monolithic integrated circuit (IC) primarily intended for use as a triggering circuit for the control of thyristors. The multistage circuit embodies a diode limiter, a threshold detector, an on/off sensing amplifier, and a Darlington output driver to provide a train of triggering pulses to the gate of a thyristor such as a triac. A detailed explantion of operation of the CA3059, along with suggested applications, appears in RCA Application Notes ICAN 4158 (published March 1970), ICAN 6158 (published May, 1971) and ICAN 6268 (published June, 1970).

Operation of the CA3059 zero-voltage switch can best be explained by reference to FIGS. 1 and 2, with all voltages referred to terminal 7 thereof.

Figure 2:
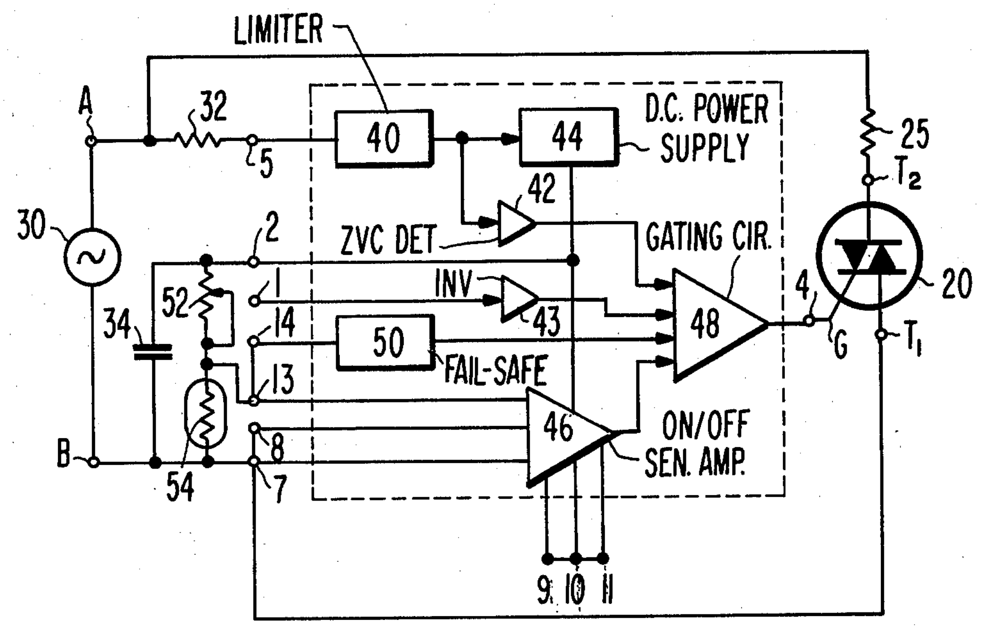
FIG. 2 PRIOR ART
FIG. 2 is a functional block diagram of a thyristor temperature controlling circuit which is useful in explaining the operation of the device illustrated in FIG. 1.

Referring first to FIG. 2, the main terminal electrodes $T_1$, $T_2$ of a triac 20 are connected in series with a load 25 between a pair of input terminals (A,B) adapted to be connected to a power source having a polarity that varies with time. Typically, though not exclusively, the power source will be a sinusoidal ac source 30, as shown in FIG. 2. The CA3059, shown circumscribed in phantom, is connected in the circuit in the manner shown to the gate electrode (G) of the triac 20. In the normal mode of operation, a dropping resistor 32 is required to limit the current in the IC the selection of resistor 32 being a function of the average current drawn from the power supply 30. Moreover, since most zero-voltage switches provide current pulses of a single polarity to the gate electrode of the triac being controlled (e.g. positive pulses in the case of the CA3059), triac selection should be made based upon operation in either the positive [i.e. I(+) and III (+)] or negative [i.e. I(−) and III (−)] gating modes.

Basically, the limiter stage 40 of the CA3059 clips the incoming AC line voltage to approximately ±8 volts. This signal is then applied to the zero-voltage crossing (ZVC) detector 42, which generates an output pulse during each passage of the line voltage through zero. The limiter output is also applied to a rectifying diode and an external capacitor 34 which together comprise a dc power supply 44. The power supply 44 provides approximately 6 volts as a $V_{cc}$ supply to the other stages of the IC. The on/off sensing amplifier 46 is basically a differential comparator. The triac gating circuit 48 contains a driver for direct triac triggering. The gating circuit is enabled when all the inputs are at a high voltage; i.e. line voltage 30 must be approximately 0 volts (to cause ZVC detector 42 to produce a high output); the sensing amplifier 46 output must be high; external voltage to terminal 1 must be a logical 0 which in turn is then inverted and transmitted to gating circuit 48 as a "high" input by inverter 43; and the output of the fail-safe circuit 50 must be high.

With reference to FIG. 1, diodes $D_1$ and $D_2$ form a symmetrical clamp which limits the voltages on the chip to ±8 volts, as discussed supra. Diodes $D_7$ and $D_{13}$ form a half wave rectifier which develops a positive voltage on the external storage capacitor 34 (which is connected to terminal 2 as shown in FIG. 2).

With the CA3059 in the ON state (i.e. providing a gating signal to the gate electrode G of the triac 20 via terminal 4) $Q_8$ and $Q_9$ are conducting, $Q_7$ is off and $Q_6$ is on. Any action that turns $Q_7$ on removes the drive from $Q_8$ and allows the thyristor to turn off. $Q_7$ may be turned on directly by application of a minimum of +1.2 volts at 10 microamperes to terminal 1 which is an external inhibit terminal. If a voltage of more than 2 volts is available, external resistance must be added to limit the current to 10 milliamperes. Diode $D_{10}$ isolates the base of $Q_7$ from other signals when an external inhibit signal is applied so that this signal is the highest priority command for normal operation. $Q_7$ may also be activated by turning off $Q_6$ to allow current to flow from the power supply through $R_7$ and $D_{10}$ to the base. $Q_6$ is normally held on by current flowing into its base through $R_2$, $D_8$ and $D_9$, when $Q_1$ is off.

$Q_1$ is a portion of the zero-crossing detector 42. When the voltage at terminal 5 is greater than +3 volts, current can flow through $R_1$, $D_6$, the base-to-emitter junction of $Q_1$ and $D_4$, to terminal 7 to turn on $Q_1$ and inhibit the pulse. For negative voltages with magnitudes greater than 3 volts, the current flows through $D_5$, the emitter-to-base junction of $Q_1$, $D_3$ and $R_1$, to terminal 5 and again turns $Q_1$ on. $Q_1$ is off only when the voltage at terminal 5 is less than the threshold voltage of approximately 2 volts.

The on/off sensing amplifier 46, comprising transistors $Q_2$, $Q_3$, $Q_4$ and $Q_5$, makes the CA3059 a flexible power control circuit. The transistor pairs $Q_2$–$Q_4$ and $Q_3$–$Q_5$ form high-beta composite PNP transistors in which the emitters of $Q_4$ and $Q_5$ act as the collectors of the composite devices. These two composite transistors are connected as a differential amplifier with $R_3$ sufficiently high in value to cause the power source for this amplifier to operate as a constant current source. The relative current flow in the two "collectors" is a function of the difference in voltage between the bases of $Q_2$ and $Q_3$. Therefore, when terminal 13 is more positive than terminal 9, little or no current flows in the collector of $Q_2$–$Q_4$; when terminal 13 is negative with respect to terminal 9, most of the current flows through that path and none in terminal 8. When current flows in $Q_2$–$Q_4$, the path is from the supply through $R_3$ through $Q_2$–$Q_4$, through the base-to-emitter junction of $Q_1$ and finally through $D_4$ to terminal 7. Therefore, when $V_{13}$ is more negative than $V_9$, $Q_1$ is on and output is inhibited.

In the temperature control circuit shown in FIG. 2, the voltage at terminal 9 of the CA3059 is derived from the supply by connection of terminals 10 and 11 to form a precision voltage divider. This divider forms one side of a transducer bridge, with resistor 52 and a negative temperature coefficient (NTC) sensor 54 forming the other. At low temperatures, the large value of the sensor 54 causes terminal 13 to be positive with respect to terminal 9 so that the thyristor fires on every half cycle and power is applied to the load 25. As the temperature increases, the sensor resistance decreases until a balance is reached and $V_{13}$ approaches $V_9$. At this point, $Q_2$–$Q_4$ begins to turn on and inhibit further pulses. The control temperature is adjusted by variation of the value of resistor 52. For cooling service, either the positions of resistor 52 and the sensor 54 may be reversed, or terminals 9 and 13 may be interchanged.

As discussed supra, one of the major problems relating to the design of integrated circuits is utilization of chip area. By diminishing the circuit area required to perform a particular function, chip utilization can be maximized with corresponding benefits in cost and efficiency.

Figure 3:
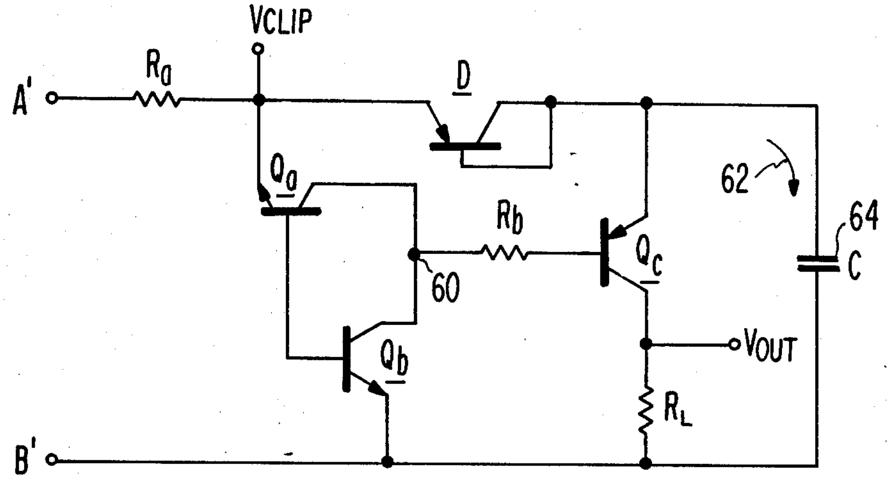
FIG. 3 is a schematic diagram of a clipping and zero-voltage detection circuit in accordance with the present invention.

FIG. 3 is illustrative of a circuit in accordance with the present invention which provides both clipping and zero-voltage detection functions and which can be used in lieu of the limiter and zero-voltage detection circuits presently incorporated in the RCA-CA3059 with a resulting space saving of about 600 square mils, or approximately 17–18 percent of the existing chip area.

A pair of NPN transistors $Q_a$ and $Q_b$ are connected base electrode-to-base electrode and collector electrode-to-collector electrode. The emitter electrode of the transistor $Q_a$ is connected through current limiting resistor $R_a$ to terminal A′ and the emitter electrode of transistor $Q_b$ is connected directly to terminal B′. This pair of terminals (A′, B′) is adapted for connection to an ac supply voltage source such as 60 Hertz source (not shown). The connected collector electrodes of the transistor pair are coupled to the base electrode of a PNP transistor $Q_c$ through a second current limiting resistor $R_b$. A diode D which may be implemented by a diode connected transistor, as shown, is connected in the forward direction to the emitter-to-collector path of transistor $Q_c$ between the emitters of transistors $Q_a$ and $Q_c$. A load resistor $R_L$ is connected between the collector of transistor $Q_c$ and terminal B′. A charging capacitor C is coupled between the emitter electrode of transistor $Q_c$ and terminal B′. For purposes of explanation, terminal B′ will be established as the point of reference potential, that is, it can be assumed to be connected to the substrate which can be considered ground.

In operation, when the potential across terminals A′ and B′ exceeds the reverse breakdown voltage [$V_{(BR)EBO}$] of the emitter-to-base junction of transistor $Q_a$ (i.e. approximately 7 volts), plus the base-to-emitter voltage [$V_{BE}$] of transistor $Q_b$ (i.e. approximately 0.7 volts,) transistor $Q_a$ operates in a zener mode and transistor $Q_b$ is biased into conduction in typical transistor fashion. The diode D also conducts. Conduction of transistor $Q_b$ places node 60 at close to ground potential. As this node connects to the base of transistor $Q_c$, which is a PNP transistor, and as its emitter is positive to the extent the voltage at A′ less the voltage drop across $R_a$ less the voltage drop across diode D, and as its collector is connected through resistor $R_b$ to ground, transistor $Q_c$ conducts. This causes a positive output signal ($V_{out}$) to appear across the load resistor $R_L$. At the same time, the capacitor C charges through diode D in the direction indicated by arrow 62, plate 64 becoming relatively positive.

When the input signal swings negative by an amount which exceeds the $V_{(BR)EBO}$ of transistor $Q_b$ plus the $V_{BE}$ of transistor $Q_a$, transistor $Q_b$ operates in a zener mode and transistor $Q_a$ operates as a transistor. In this operation, transistor $Q_a$ conducts and places node 60 at a negative potential equal to the voltage at A′ less the sum of the voltage drop across resistor $R_a$ and across the emitter-to-collector path of transistor $Q_a$ (assuming the use of discrete transistors). In an integrated circuit implementation the collector to substrate diodes of transistors $Q_a$ and $Q_b$ become forward biased under these conditions, so the voltage at node 60 is placed at a voltage one diode drop below that at terminal B′, that is, $V_B$ −0.7 volts. In either case, the anode (emitter) of "diode" D is negative relative to its cathode (common base-collector) so that it does not conduct. However, the emitter of PNP transistor $Q_c$ is positive in view of the charged condition of capacitor C and its collector is connected to ground through resistor $R_L$. Therefore, transistor $Q_c$ conducts, operating as a discharge circuit for capacitor C and again a positive voltage appears at $V_{out}$.

From the explanation above, it will be seen that except for the interval when the input voltage applied across terminals A′ and B′ is between ±7.7 volts, a positive output signal (relative to ground) is present across load resistor $R_L$. The transistor $Q_c$ operates at saturation when it conducts so that the voltage $V_{out}$ across $R_L$ during the conducting intervals is at a fixed relatively positive level (the wave is flat-topped). During the time that the input voltage is between ±7.7 volts (i.e. a pulse width of approximately 266 microseconds centered about the zero crossing of a 60 cycle ac signal, as shown in FIG. 4) no output signal appears across the output resistor, that is, $V_{out}$ goes to the substrate potential (ground).

Figure 4:
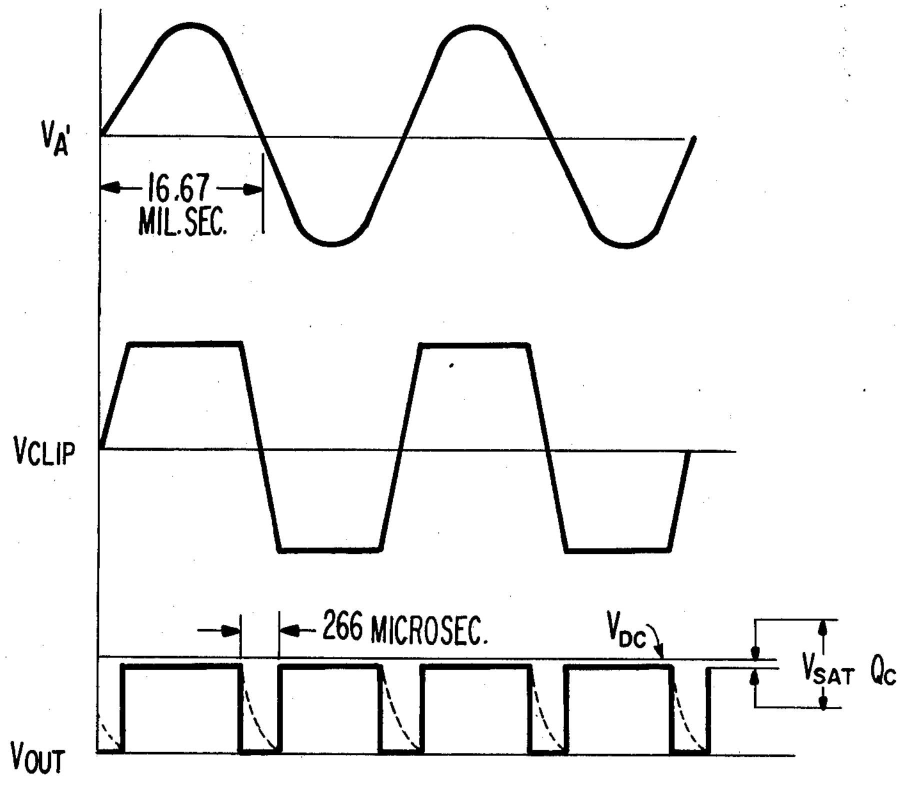
FIG. 4 shows a series of waveforms obtained in the operation of the circuit of FIG. 3.

FIG. 4 is a somewhat idealized showing of the waveforms present in the circuit of FIG. 3. The transistor $Q_a$ can be in saturation or not when transistor $Q_b$ is in the zener mode or vice versa. However, if a transistor ($Q_a$ or $Q_b$) in saturation comes out of saturation slowly or if the node 60 has substantial distributed capacitance, the lagging edge of the flat-topped wave requires more time to reach the zero level. This is indicated by dashed lines at $V_{out}$. Whether or not the transistors $Q_a$ and $Q_b$ are driven to saturation, they drive the base of transistor $Q_c$ sufficiently "hard" to operate transistor $Q_c$ at saturation, when it conducts, as indicated at $V_{out}$.

When transistor $Q_b$ is acting as a zener diode and $Q_a$ as a transistor, there is a sneak path for current flow which is not desirable. During the negative peaks at A′, B′ is relatively positive with respect to the collector of transistor $Q_a$, that is, the collector of transistor $Q_a$ is relatively negative compared to the substrate and relatively positive with respect to the emitter of transistor $Q_a$ and terminal A′. Therefore, current can flow from node 60 through transistor $Q_a$. However, this current is limited to a low value by resistor $R_a$ and can be further limited by resistors (not shown) external of the chip and in series between terminal A and the ac power supply terminal.

In the CA3059 referred to above, all devices are actually isolated from the substrate by a region of N+ semiconductor material around each device—each device "floats" with respect to the substrate. This takes up space. Moreover, each N+ isolation region is essentially a capacitor and this capacitance limits, to a certain extent, the frequency capability of the circuit. In the present arrangement fewer devices are required than previously and the isolation "rings" are omitted. Both save space.

In the present circuit, diode D is preferably a diode-connected PNP lateral device. In such a circuit, during the reverse voltage across the diode D, it does not break down since the breakdown voltage of a single lateral device is considerably higher than that of a single conventional vertical device. Forming transistor $Q_c$ in similar fashion (i.e. a PNP lateral device) and without isolation rings similarly serves to alleviate the capacitance problems discussed above. The lateral formation of $Q_c$ with sufficiently high beta (i.e. 50), as desired in the present circuit, is within the capability of the present state of the art.

Figure 5:
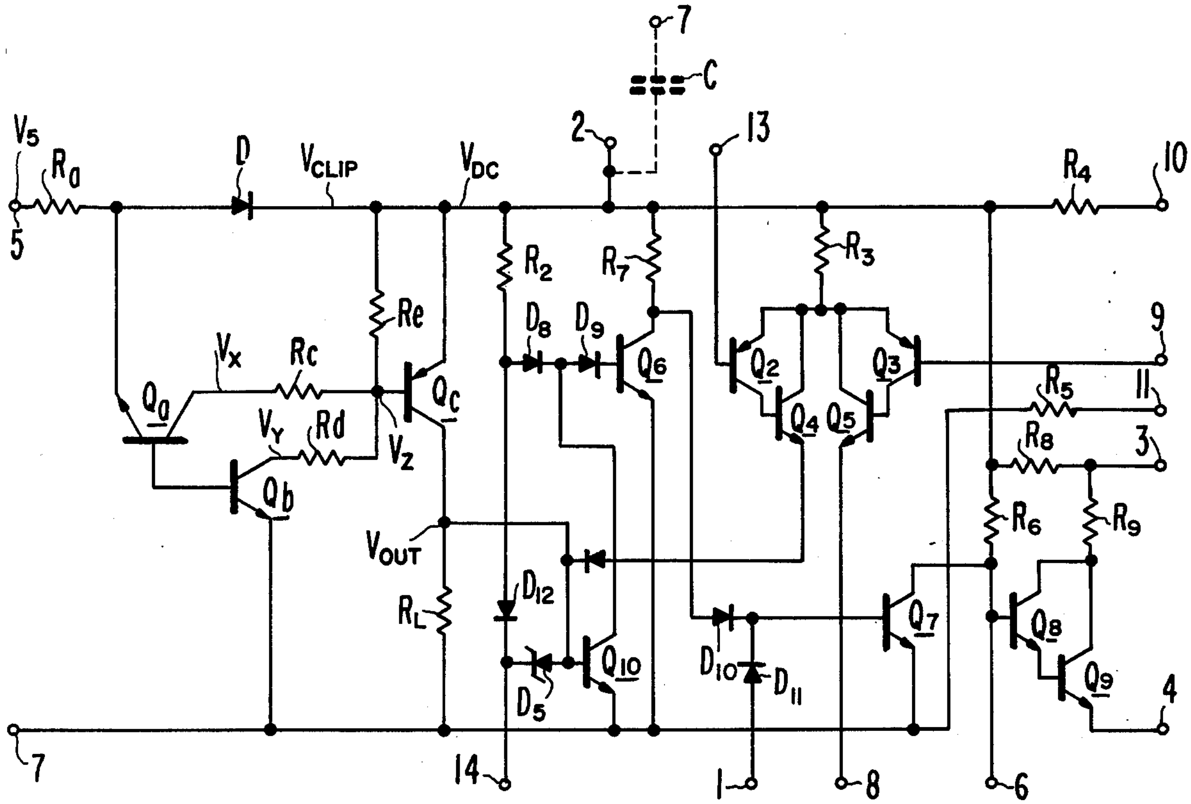
FIG. 5 is a schematic diagram of an integrated circuit device incorporating an embodiment of the present invention.

FIG. 5 illustrates a modified version of the RCA CA3059 which includes an embodiment of the present invention. The capacitance C, which is off the chip, is illustrated in phantom. The circuit includes the elements of FIG. 3 and, in addition, resistors $R_c$, $R_d$ and $R_e$. Resistors $R_c$ and $R_d$ are current limiting resistors and also provide buffering between transistor $Q_c$ on the one hand, and $Q_a$ and $Q_b$ on the other hand. Resistor $R_e$ establishes a bias voltage requirement for $Q_c$, thereby preventing the flow of leakage current. The diode D may be a diode connected transistor as in FIG. 3.

The function of resistors $R_c$ and $R_d$ can be best understood by returning a moment to FIG. 3. Assume transistor $Q_b$ operating conventionally and transistor $Q_a$ operating in the zener mode. If transistor $Q_b$ goes to saturation with its collector at 0.3 volts or less, this is the potential on the collector of transistor $Q_a$ which is conducting emitter-to-base in its zener mode. The base of transistor $Q_a$ is at the same potential as the base of transistor $Q_b$, namely at +0.7 volts (the base-emitter potential of transistor $Q_b$). Thus, transistor $Q_a$ (which is not operating in the transistor mode) has its collector-to-base junction forward biased to the extent of 0.4 volts. Under some marginal conditions, the forward bias can be even greater and can result in excessive current flow through the junction and even latching. The resistors $R_c$ and $R_d$ limit any such currents and prevent undesired operation of this kind.

The function of resistor $R_e$ is to establish a bias level. The base emitter voltage $V_{BE}$ of transistor $Q_c$ must reach some given value, such as 0.7 volt, before conduction can occur. The smaller the value of $R_e$, the more current will be required to develop this value of voltage. Thus proper choice of the value of $R_e$, can insure that small thermal currents do not develop sufficient $V_{BE}$ across the resistor $R_e$ to turn device $Q_c$ on, while still permitting the drive signal produced by transistors $Q_a$ and $Q_b$ to operate device $Q_c$. The resistor $R_e$ also discriminates against small perterbations which may be present at the start of conduction of transistor $Q_c$.

With respect to the operation of the circuit depicted in FIG. 5, when the potential across the emitter electrodes of transistors $Q_a$ and $Q_b$ exceeds 7.7 volts (i.e. $V_{(BR)EBO} + V_{BE}$), transistor $Q_c$ is biased into conduction and then operates in saturation. An output signal is derived from across $R_L$ which in turn provides base current to bias transistor $Q_{10}$ into conduction. The remaining stages of the circuit operate in the manner heretofore described with reference to FIG. 1, resulting in the absence of a triggering pulse at terminal 4. When the potential across the emitters of $Q_a$ and $Q_b$ is less than 7.7 volts, no output signal is available across $R_1$, $Q_{10}$ is kept out of conduction (in the absence of an inhibit signal via $Q_4$ or $D_5$), and an output pulse is provided via the Darlington configuration comprising $Q_8m$ and $Q_9$, as heretofore described.

Figure 6:
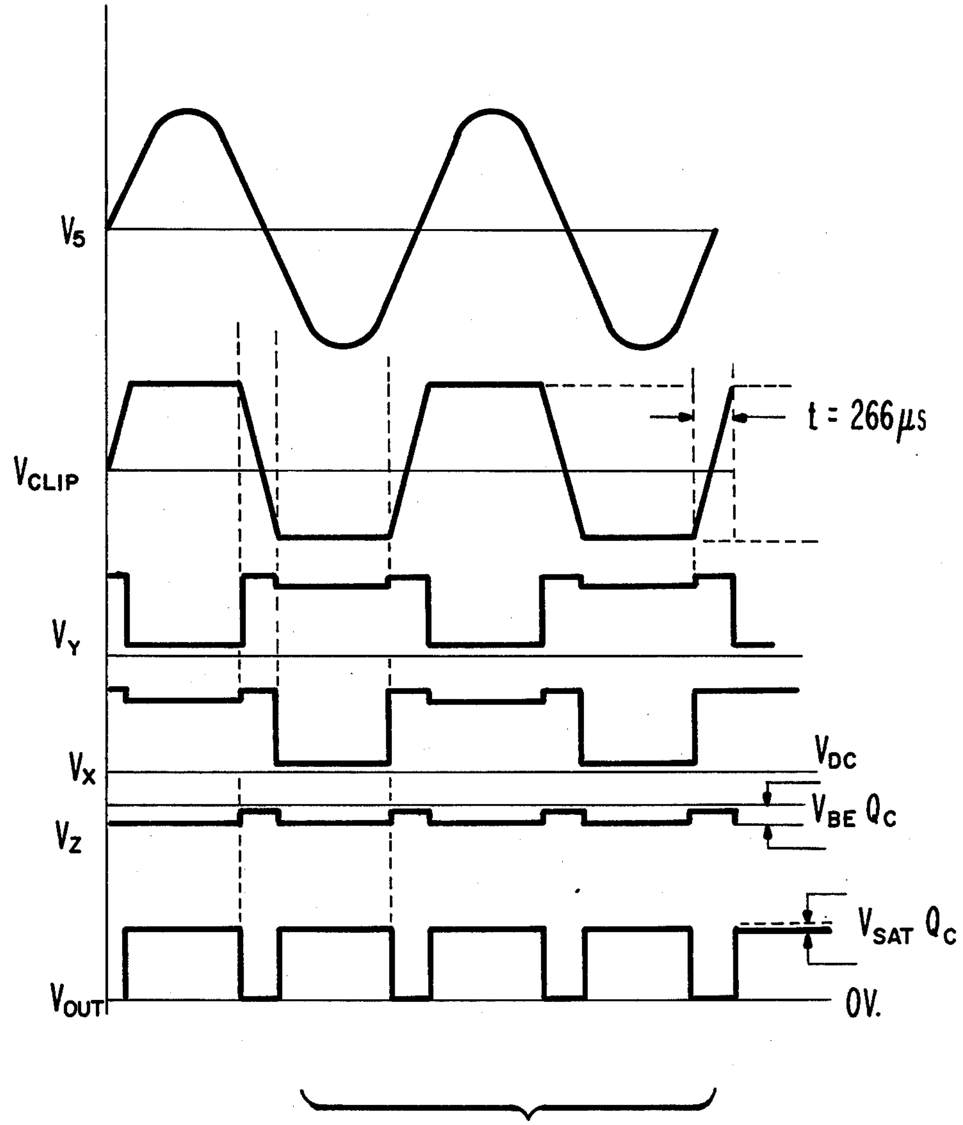
FIG. 6 illustrates waveforms present in the circuit of FIG. 5.

The waveforms for the operation of the circuit of FIG. 5 are shown in FIG. 6.

What is claimed is:

1. In combination, a pair of transistors each having emitter, base and collector electrodes;

means for connecting the base-to-emitter paths of said transistor pair in series circuit with each other, the base-emitter junctions of said paths being oppositely poled with respect to each other;

a third transistor having emitter, base and collector electrodes;

means for coupling the emitter-to-collector path of said third transistor in shunting circuit with said series circuit;

means for applying a periodically varying potential across said series circuit to alternately forward bias the base-emitter junction of one of said transistors through the reverse breakdown voltage of the base-emitter junction of the other of said transistors when the potential across said series circuit exceeds a predetermined magnitude, whereby said one transistor is rendered conductive and said other transistor is rendered nonconductive between the emitter and collector electrodes thereof respectively;

means for applying a biasing signal derived from the collector electrode of said one transistor to the base electrode of said third transistor only when said predetermined magnitude is exceeded;

output means responsive to the conduction state of said third transistor.

2. The invention as defined in claim 1 further comprising:

energy storing means connected in circuit with said third transistor;

means for charging said energy storing means when said potential is of a given polarity;

means for discharging said energy storing means through said third transistor when said potential is of a polarity opposite to said given polarity and when said predetermined magnitude is exceeded.

3. A clamping and zero crossing detection circuit adapted for use in integrated form comprising a pair of transistors of like conductivity type each having emitter, base and collector electrodes;

a pair of input terminals adapted for connection to a periodically varying source of potential, each of said terminals connected to a respective one of said emitter electrodes;

means for connecting said base electrodes in common circuit;

means for connecting said collector electrodes in common circuit;

a further transistor having an emitter, a base, and a collector electrode;

output means connected in series circuit with the emitter-to-collector path of said further transistor;

means for connecting said series circuit in circuit with said input terminals;

means for connecting said commonly coupled collector electrodes to the base electrode of said further transistor, whereby the base-emitter junction of one of said transistor pair is forward biased through the reverse breakdown voltage of the base-emitter junction of the other transistor of said pair to render said one transistor conductive and said other transistor nonconductive between the emitter and collector electrodes thereof when the potential applied to said input terminals is of a given polarity and exceeds a predetermined magnitude to provide an indication of the zero crossing point of said periodically varying source at said output means.

4. A clamping and detection circuit as defined in claim 3 further comprising energy storing means connected in circuit with said further transistor;

means for charging said energy storing means only when said applied potential is of said given polarity;

means for discharging said energy storing means through said series circuit when said applied potential is of opposite polarity to said given polarity and exceeds said predetermined magnitude.

5. A clamping and detection circuit as defined in claim 4 wherein said charging means comprises a diode-connected PNP lateral device.

6. A zero-voltage detection circuit for an integrated-circuit device comprising:

a pair of NPN transistors having emitter, base and collector electrodes, the base electrodes of said transistor pair being connected in common;

a pair of input terminals adapted for connection to a periodically varying source of potential, each of said terminals connected to a respective one of said emitter electrodes;

A PNP lateral transistor having an emitter, a base, and a collector electrode;

first and second resistance means connecting the respective collector electrodes of said transistor pair to the base electrode of said lateral transistor;

a diode-connected PNP lateral device connected between the emitter electrode of a given one transistor of said transistor pair and the emitter electrode of said PNP lateral transistor;

output means connected between the emitter electrode of the other transistor of said transistor pair and the collector electrode of said PNP lateral transistor;

means for connecting a source of load current for said lateral transistor when said diode-connected device is reverse biased.

7. A zero-voltage detection circuit for an integrated circuit as defined in claim 6 comprising a further resistance connected between the base and emitter electrodes of said PNP lateral transistor.

8. A circuit for passing current through a load when an input of an alternating voltage is greater than a given value in either polarity comprising, in combination:

a closed loop which includes, in series, a charge storage means the load, and a swtich;

two transistors of the same conductivity type, each having a base, a collector and an emitter electrode, connected base electrode to base electrode and collector electrode to collector electrode;

means for applying said alternating voltage between the emitter electrodes of said two transistors at a level such that when said voltage exceeds said value in one polarity, one transistor conducts in the forward direction and the other in reverse breakdown mode and when said voltage exceeds said value in the other polarity, said one transistor conducts in the reverse breakdown mode and said other in the forward direction;

means responsive to the conducting condition of the two transistors for closing said switch; and means responsive to said voltage only when it is of one polarity for charging the charge storage means.

9. A circuit as set forth in claim 8 wherein said switch comprises means having current limiting properties.

10. A circuit as set forth in claim 8 wherein said switch comprises a third transistor having a base, a collector and an emitter electrode, whose emitter electrode-to-collector electrode path is in the loop.

11. A circuit as set forth in claim 10 wherein said means for closing said switch comprises a connection from the collector electrodes of said two transistors to the base electrode of said third transistor.

12. A circuit as set forth in claim 8 wherein said means responsive to said voltage only when it is of one polarity comprises an asymmetrically conducting device.

13. A circuit for passing current through a load when an input voltage of either polarity, applied across a pair of input terminals, exceeds a given magnitude, comprising:

a charge storage means and a switch connected in series with said load in a closed loop, said switch having a control terminal;

a unidirectionally conducting device connecting said charge storage means in a charge path across said pair of input terminals; and control means connected across said pair of input terminals for rendering said switch conductive when the input voltage exceeds said given magnitude in either polarity direction, said control means including two transistors of the same conductivity type, each having a base, a collector and an emitter electrode, said transistors direct current connected base electrode-to-base-electrode and collector-electrode-to-collector-electrode, with their collector-electrode-to-emitter-electrode paths connected in a series path across said pair of input terminals, and a connection from a point on said series path to said control terminal of said switch.

14. A circuit as set forth in claim 13 wherein said switch comprises a third transistor having a base, a collector and an emitter electrode, whose emitter electrode-to-collector electrode path in connected in said loop.

15. A circuit as set forth in claim 14 wherein said connection from a point on said series path to said control terminal of said switch comprises a connection from between the collector electrodes of said two transistors to the base electrode of said third transistor.

16. A circuit as set forth in claim 13 wherein said direct current connection of collector electrodes comprises resistor means connecting one collector electrode to a circuit point and second resistor means connecting the other collector electrode to said circuit point.

17. A circuit as set forth in claim 16, wherein the connection from a point on said series path comprises a connection from said circuit point to said control terminal.

18. In combination:

two terminals across which an alternating voltage may be applied;

two transistors of the same conductivity type, each having a base, a collector and an emitter electrode, direct current connected base electrode-to-base electrode and collector-electrode-to-collector electrode, one transistor connected at its emitter electrode to one of said terminals and the other connected at its emitter electrode to the other of said terminals;

an output terminal at the direct current connection of said collector electrodes; and output circuit means coupled to said output terminal.

* * * * *